(12) United States Patent
Ando et al.

(10) Patent No.: US 9,634,116 B2
(45) Date of Patent: *Apr. 25, 2017

(54) METHOD TO IMPROVE RELIABILITY OF HIGH-K METAL GATE STACKS

(71) Applicant: INTERNATIONAL BUSINESS MACHINES CORPORATION, Armonk, NY (US)

(72) Inventors: Takashi Ando, Tuckahoe, NY (US); Eduard A. Cartier, New York, NY (US); Barry P. Linder, Hastings-upon-Hudson, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/058,512

(22) Filed: Mar. 2, 2016

(65) Prior Publication Data

US 2016/0181397 A1 Jun. 23, 2016

Related U.S. Application Data

(63) Continuation of application No. 13/662,505, filed on Oct. 28, 2012, now Pat. No. 9,299,802.

(51) Int. Cl.
*H01L 21/338* (2006.01)
*H01L 29/66* (2006.01)
(Continued)

(52) U.S. Cl.
CPC .... *H01L 29/66545* (2013.01); *H01L 21/2855* (2013.01); *H01L 21/28176* (2013.01); *H01L 21/28185* (2013.01); *H01L 21/28556* (2013.01); *H01L 21/3003* (2013.01); *H01L 21/30625* (2013.01); *H01L 21/324* (2013.01); *H01L 29/4966* (2013.01); *H01L 29/66795* (2013.01); *H01L 29/518* (2013.01); *H01L 29/785* (2013.01)

(58) Field of Classification Search
CPC H01L 29/66545; H01L 31/324; H01L 29/517
USPC ......... 438/183, 184, 197, 216; 257/E21.409, 257/E21.295
See application file for complete search history.

(56) References Cited

U.S. PATENT DOCUMENTS 6,921,711 B2 7/2005 Cabral, Jr. et al.
6,982,230 B2 1/2006 Cabral, Jr. et al.
(Continued)

OTHER PUBLICATIONS

M. Chudzik, et al., "High-performance high-k/metal gates for 45nm CMOS and beyond with gate-first processing," IEEE Symposium on VLSI Technology, Jun. 12-14, 2007, pp. 194-195.
(Continued)

*Primary Examiner* — Julia Slutsker
(74) *Attorney, Agent, or Firm* — Tutunjian & Bitetto, P.C.; Vazken Alexanian

(57) ABSTRACT

A method of fabricating a gate stack for a semiconductor device includes the following steps after removal of a dummy gate: growing a high-k dielectric layer over an area vacated by the dummy gate; depositing a thin metal layer over the high-k dielectric layer; annealing the replacement gate structure in an ambient atmosphere containing hydrogen; and depositing a gap fill layer.

20 Claims, 4 Drawing Sheets

(51) Int. Cl.
*H01L 21/28* (2006.01)
*H01L 21/30* (2006.01)
*H01L 29/49* (2006.01)
*H01L 21/285* (2006.01)
*H01L 21/306* (2006.01)
*H01L 21/324* (2006.01)
*H01L 29/51* (2006.01)
*H01L 29/78* (2006.01)

(56) References Cited

U.S. PATENT DOCUMENTS

| | | |
|---|---|---|
| 7,078,282 B2 | 7/2006 | Chau et al. |
| 7,479,683 B2 | 1/2009 | Bojarczuk, Jr. et al. |
| 7,759,747 B2 | 7/2010 | Forbes et al. |
| 9,299,802 B2 * | 3/2016 | Ando ................ H01L 21/28176 |
| 2005/0250318 A1 | 11/2005 | Narayanan et al. |
| 2008/0242012 A1 | 10/2008 | Pae et al. |
| 2011/0081774 A1 | 4/2011 | Yeh et al. |
| 2011/0156107 A1 | 6/2011 | Bohr et al. |
| 2011/0195570 A1 * | 8/2011 | Lin ....................... C23C 14/022 438/652 |
| 2012/0161251 A1 | 6/2012 | Haverty et al. |
| 2012/0238086 A1 | 9/2012 | Hempel et al. |

OTHER PUBLICATIONS

K. Mistry et al., "A 45nm Logic Technology with High-k + Metal Gate Transistors, Strained Silicon, 9 Cu Interconnect Layers, 193 nm Dry Patterning, and 100% Pb-free Packaging," IEEE International Electron Devices Meeting, IEDM 2007. Dec. 10-12, 2007, pp. 247-250.

C. Ren et al., "A dual-metal gate integration process for CMOS with sub-1-nm EOT HfO2 by using HfN replacement gate," IEEE Electron Device Letters, vol. 24, No. 8, Aug. 2004, pp. 580-582.

H. Kim et al., "Engineering chemically abrupt high-k metal oxide/silicon interfaces using an oxygen-gettering metal overlayer," J. Appl. Phys., vol. 96, 2004, 3467, 6 pages.

W. Tsai et al., "Challenges in integration of metal gate high-k dielectrics gate stacks," in Advanced short-time thermal processing for Si-based CMOS devices II, Proc. ECS, 2004, pp. 321-327.

* cited by examiner

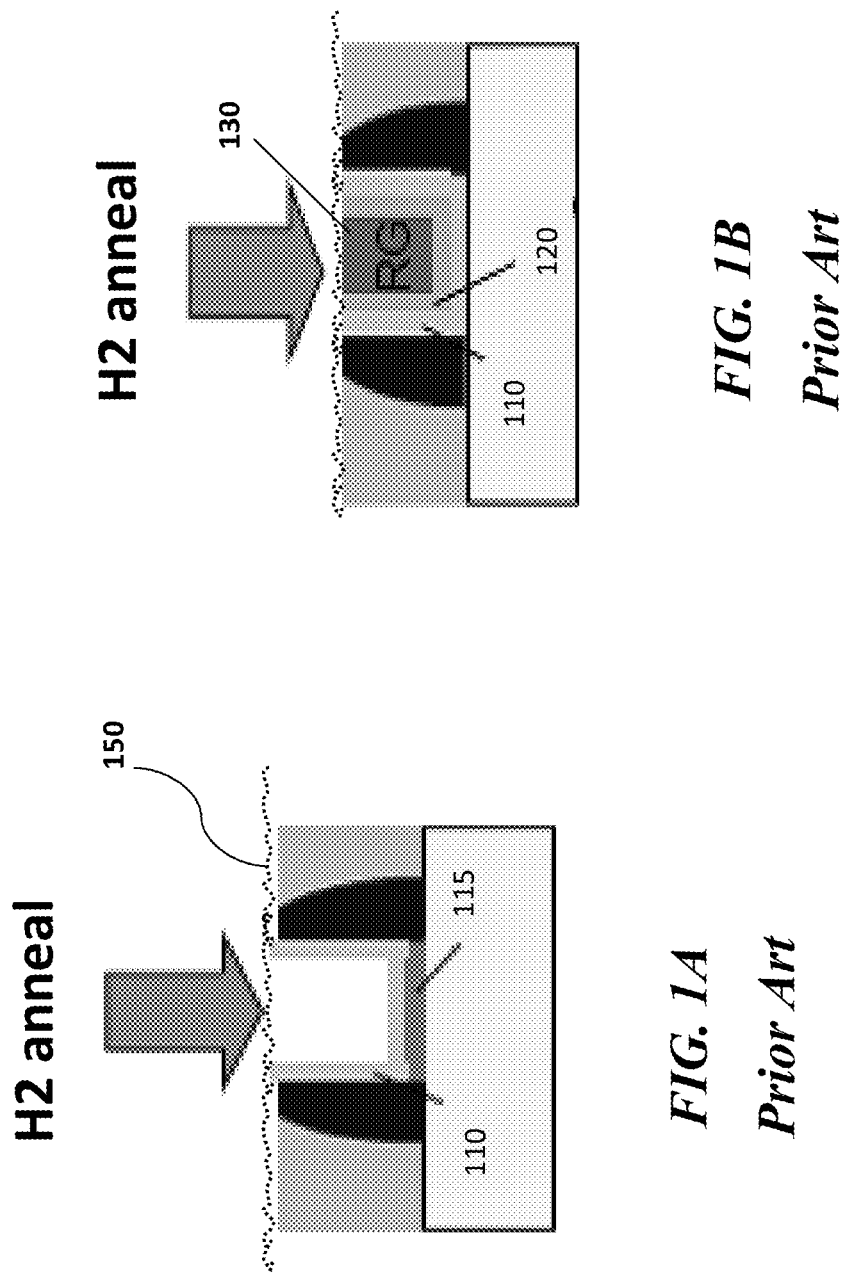

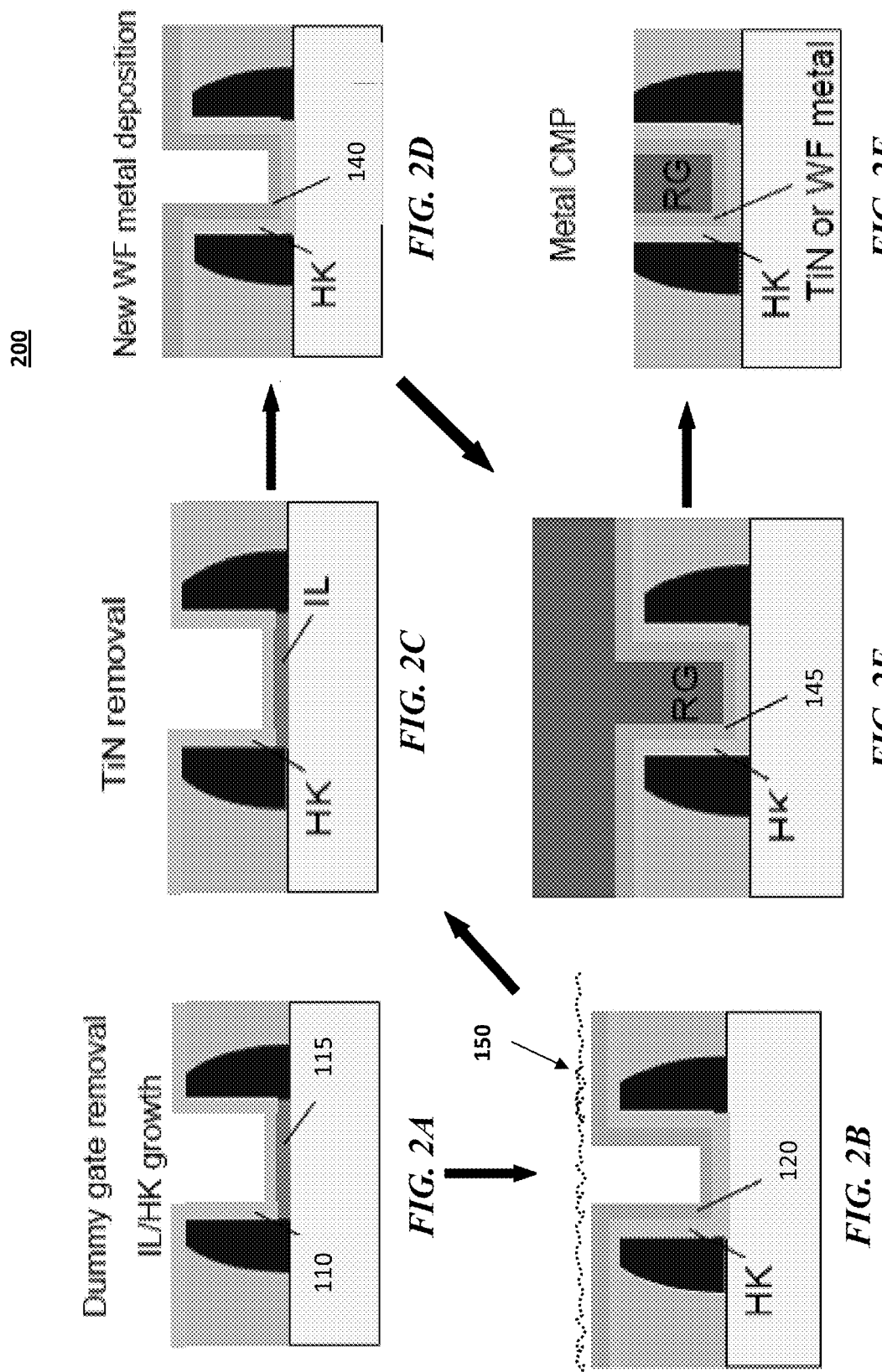

METHOD TO IMPROVE RELIABILITY OF HIGH-K METAL GATE STACKS

FIELD OF THE INVENTION

The invention disclosed broadly relates to the field of integrated circuit fabrication, and more particularly relates to improving the reliability of high-k transistors using a replacement gate fabrication process.

BACKGROUND OF THE INVENTION

In the semiconductor industry, Moore's law states that the number of transistors on a chip doubles approximately every two years. These exponential performance gains present a challenge to the semiconductor manufacturing industry, along with the dual challenges of promoting power savings and providing cooling efficiency. The industry addresses these challenges in multiple ways. Selecting the gate dielectric and gate electrode are critical choices in enabling device scaling, and compatibility with CMOS technology. Two main approaches have emerged in high-k and metal gate (HKMG) integration: gate-first and gate-last. Gate-last is also called replacement metal gate (RMG) where the gate electrode is deposited after S/D junctions are formed and the high-k gate dielectric is deposited at the beginning of the process (high-k first).

A high-k first gate-last process is when the high-k dielectric is deposited first and the metal is deposited last (gate-last method). Gate-last is often referred to as the replacement gate option. "First" and "last"—gate denotes whether the metal gate electrode is deposited before or after the high temperature anneal process. Typically, reliability of high-k gate stacks improve as a result of dopant activation anneal at temperatures around 1000° C., which is built in for gate-first or high-k first gate-last processes. The high-k last gate-last (replacement gate) process, However, lacks such built-in high temperature treatment, and thus reliability is a big challenge.

Referring now in specific detail to the drawings, and particularly to FIGS. 1A and 1B, there is provided a simplified pictorial illustration of the gate fabrication process using a hydrogen (H2) anneal, according to the known art. Hydrogen gas is favored for its gate oxide reliability. FIG. 1A shows H2 150 annealed directly on a high-k layer 110. The problems with this process are twofold: 1) the formation of oxygen vacancies in the high-k dielectric 110; and 2) an undesired Vt shift, causing gate leakage degradation.

In FIG. 1B we provide a simplified illustration of another gate fabrication process using an H2 anneal 150 on a full structure with a replacement gate 130 in place, according to the known art. In this method, the supply of hydrogen is blocked by the metal layers. Moreover, the degree of interface passivation depends on the device size (large devices can be un-passivated).

We provide a glossary of terms used throughout this disclosure:

Glossary.
k—dielectric constant value
high-k—having a "k" value higher than 3.9 k, the dielectric constant of silicon dioxide
CMOS—complementary metal-oxide semiconductor
FET—field effect transistor
FinFET—a fin-based, multigate FET
MOSFET—a metal-oxide semiconductor FET
CMP—chemical/mechanical polishing
Dit—interface states
RTA—rapid thermal anneal
HfO2—hafnium oxide
H2—hydrogen
D2—deuterium
A-Si—amorphous silicon
ALD—atomic layer deposition
PVD—physical vapor deposition
SiOx—silicon oxide
SiGe—silicon germanide
SiC—silicon carbide
RIE—reactive ion etching
ODL—optically dense layer; organically dielectric layer
STI—shallow trench isolation
S/D—source and drain terminals
NiSi—nickel silicide
C (DLC)—metal-free diamond-like carbon coating
SiN—silicon nitride
TDDB—time dependent dielectric breakdown
NBTI—negative bias temperature instability
PBTI—positive bias temperature instability
RTA—rapid thermal annealing
IL/HK—interfacial layer/high-k dielectric layer
TiN—titanium nitride
TiC—titanium carbide
TaN—tantalum nitride
TaC—tantalum carbide
TiAl—titanium aluminide
N2—nitrogen
Al—aluminide
W—tungsten
HfO2—Hafnium-based high-k dielectric

SUMMARY OF THE INVENTION

Briefly, according to an embodiment of the invention a method of fabricating a gate stack for a semiconductor device includes the following steps performed after removal of a dummy gate. Providing a replacement gate structure includes: growing a high-k dielectric layer over an area vacated by the dummy gate; depositing a thin metal layer over the high-k dielectric layer; annealing the replacement gate structure in an ambient atmosphere containing hydrogen; and depositing a gap fill layer.

According to another embodiment of the present invention a method of fabricating a gate stack for a semiconductor device includes the following steps performed after removal of a dummy gate. Providing a replacement gate structure includes: growing a high-k dielectric layer over an area vacated by the dummy gate; depositing a thin metal layer over the high-k dielectric layer; annealing the replacement gate structure in an ambient atmosphere containing hydrogen; removing the thin metal layer after annealing; depositing a metal layer of low resistivity metal; and depositing a gap fill layer.

According to an embodiment of the invention a method of fabricating a gate stack for a FinFET device includes the following steps performed after removal of a dummy gate. Providing a replacement gate structure includes: growing a high-k dielectric layer over an area vacated by the dummy gate; depositing a thin metal layer over the high-k dielectric layer; annealing the replacement gate structure in an ambient atmosphere containing hydrogen; and depositing a gap fill layer.

BRIEF DESCRIPTION OF THE SEVERAL VIEWS OF THE DRAWINGS

To describe the foregoing and other exemplary purposes, aspects, and advantages, we use the following detailed description of an exemplary embodiment of the invention with reference to the drawings, in which:

FIGS. 1A and 1B show schematics for conventional methods of H2 anneal on RMG devices;

FIGS. 2A through 2F show a gate structure undergoing the replacement gate process, according to an embodiment of the present invention;

Figure 3C:
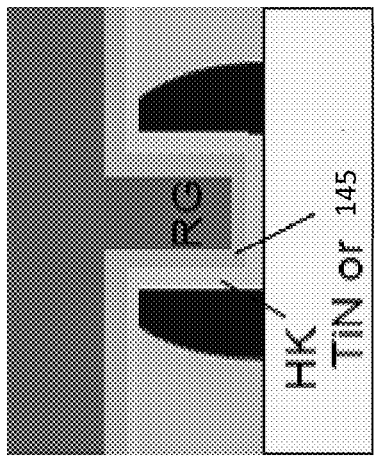
FIGS. 3A through 3D show a gate structure undergoing the replacement gate process, according to another embodiment of the present invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

Before describing in detail embodiments that are in accordance with the present invention, it should be observed that the embodiments have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

We discuss a gate-last, high-k metal gate fabrication with a novel improvement in reliability. We achieve this reliability by incorporating hydrogen (H2) only in the thin metal and the high-k layer. Additionally, the H2 remains in the final film. We perform a passivation anneal with ambient H2 after the thin metal deposition. Our anneal process is performed at temperatures of 600 to 700 C on thin metal (TiN, TiC, TaN, TaC). The metal's thickness is between 10 and 50 angstroms. This fabrication method can be advantageously implemented in various CMOS devices, including FinFET devices. We use only an intermediate thermal treatment after dopant activation. This removes any dopant activation or S/D junction diffusion concerns.

Referring now to FIGS. 2A through 2F, we describe a gate-last, high-k metal gate. FIG. 2A we show the gate structure 200 after removal of the dummy (sacrificial) gate. We grow an interfacial layer and deposit a high-k dielectric 110. In FIG. 2B, we show the gate structure 200 after deposition of a gate metal layer 120. The gate metal layer 120 in this embodiment is a thin metal layer with a thickness of approximately 10 to 50 angstroms. It is preferably a thermally stable metal alloy, such as TiN, TiC, TaN, or TaC. The gate metal layer 120 can be deposited via atomic layer deposition (ALD) or physical vapor deposition (PVD). After deposition of the thin metal layer 120, we follow with an anneal in an ambient atmosphere containing H2 at 600-700 C.

In FIG. 2C we show an optional step of removing the thin metal layer 120 after it has been annealed in H2 150. After optionally removing the thin metal layer 120 we follow with deposition of a work function metal 140. This is shown in FIG. 2D. The work function metal 140 can be a metal alloy, such as TiAl or TiN. It serves the purpose of setting the threshold voltage of the device to appropriate values. In FIG. 2E we show the gate structure 200 after deposition of a gap fill metal 145 to finish the replacement gate 200. The gap fill metal 145 can be Al, or W. Lastly, in FIG. 2F we show the gate structure 200 after performing chemical/mechanical polishing (CMP), a planarization process.

Figure 3B:
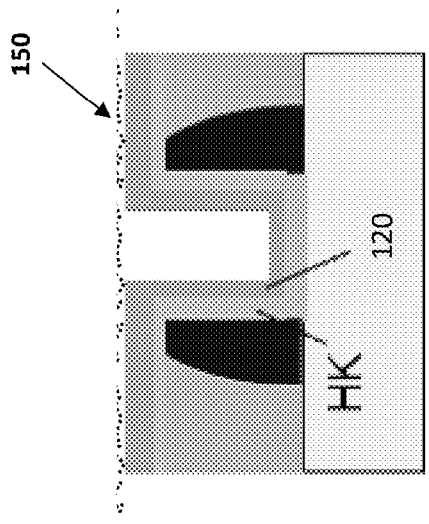
Figure 3D:
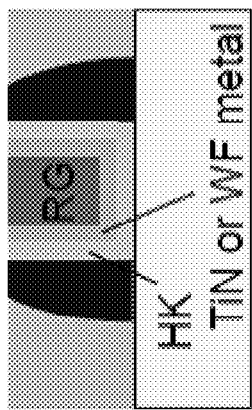
Figure 3A:
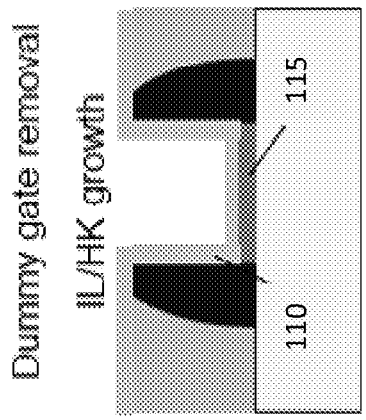

Referring now to FIGS. 3A through 3D we describe another gate-last, high-k metal gate with a novel improvement in reliability. In FIG. 3A, just as in FIG. 2A, we show the gate structure 300 after removal of the dummy (sacrificial) gate. We grow an interfacial layer and deposit a high-k dielectric 110. In FIG. 3B, we show the gate structure 200 after deposition of a gate metal layer 120. The gate metal layer 120 in this embodiment is a thin metal layer 120 with a thickness of approximately 10 to 50 angstroms. It is preferably a thermally stable metal alloy, such as TiN, TiC, TaN, or TaC.

The gate metal layer 120 can be deposited via atomic layer deposition (ALD) or physical vapor deposition (PVD). After deposition of the thin metal layer 120, we follow with an anneal in an ambient atmosphere containing H2 at 600°-700° C. The H2 anneal with the presence of the thin metal layer 120 enables a direct supply of active H species to the interface while suppressing reduction of HfO2. We show a reliability improvement without degradation in the effective work function and gate leakage current.

In FIG. 3C we show the gate structure 300 after deposition of a gap fill metal 145 to finish the replacement gate 300. The gap fill metal 145 can be Al, or W. Lastly, in FIG. 3D we show the gate structure 300 after performing chemical/mechanical polishing (CMP), a planarization process.

Figure 4:
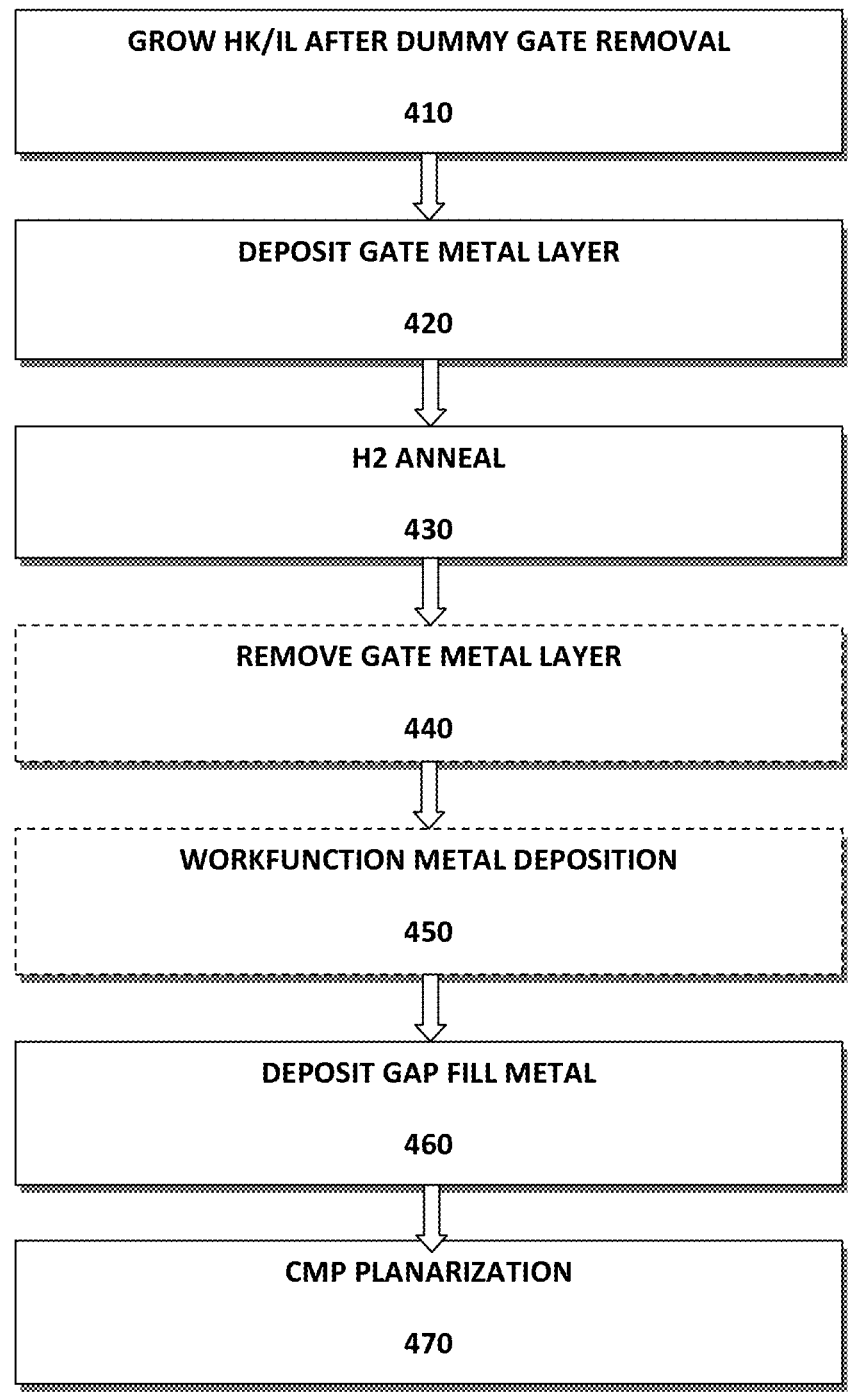
FIG. 4 is a flowchart of a method according to an embodiment of the invention.

We will now discuss the process steps for gate last high-k gate fabrication with respect to the flowcharts of FIG. 4. Optional steps are depicted in dotted boxes. It will be apparent to those with knowledge in the art that the fabrication of a gate stack on a semiconductor device involves more steps than are shown in FIG. 4. For example, we skip over the source/drain junction formation and show the process after the dummy gate has been removed. For clarity, we concentrate our explanation on those steps that deviate from the conventional fabrication of the high-k gate.

Referring now to FIG. 4, we show a flowchart 400 of the process for fabricating a gate-last high-k metal gate according to the embodiment of FIGS. 2A through 2F. In step 410 we grow an interfacial layer and deposit a high-k metal 110 after the dummy gate removal. In step 420 we deposit the gate metal layer 120. This is followed by an H2 anneal at a range of 600° C. to 700° C. in step 430.

Next, we can optionally remove the thin metal layer 120 in step 440. If we remove the metal 120 in step 440, then in step 450 we deposit a work function setting metal. Next, we deposit a gap fill metal 140 of low resistivity in step 460 and finish with CMP planarization in step 470. The benefits and advantages to this embodiment are:

1. Enables a direct supply of active H species to the interface while suppressing reduction of HfO2.

2. Reliability improvement without degradation in the effective work function and gate leakage current.

Therefore, while there has been described what is presently considered to be the preferred embodiment, it will be understood by those skilled in the art that other modifications can be made within the spirit of the invention. The above description(s) of embodiment(s) is not intended to be exhaustive or limiting in scope. The embodiment(s), as described, were chosen in order to explain the principles of the invention, show its practical application, and enable those with ordinary skill in the art to understand how to make and use the invention. It should be understood that the invention is not limited to the embodiment(s) described above, but rather should be interpreted within the full meaning and scope of the appended claims.

What is claimed is:

1. A method of fabricating a gate stack for a semiconductor device, said method comprising steps of:
    growing a gate dielectric layer over an area vacated by a dummy gate being removed;
    depositing a first metal layer comprising at least one of TiN, TaN, TiC, and TaC on the gate dielectric layer;
    annealing the replacement gate structure in an ambient atmosphere containing hydrogen gas after said depositing the first metal layer
    removing the first metal layer after the annealing step;
    depositing a second metal layer of low resistivity metal; and
    depositing a gap fill layer over the annealed replacement gate structure.

2. The method of claim 1 wherein the annealing is performed at a temperature range of 600° C.-700° C.

3. The method of claim 1 wherein depositing the second metal layer of low resistivity metal comprises:
    depositing a work function metal; and
    depositing a gap fill metal of low resistivity.

4. The method of claim 1 wherein depositing the first metal layer comprises depositing a thermally stable metal alloy.

5. The method of claim 4 wherein depositing the thermally stable metal alloy comprises deposition by atomic layer deposition.

6. The method of claim 5 wherein depositing the thermally stable metal alloy comprises deposition by physical vapor deposition.

7. The method of claim 1 further comprising:
    performing chemical mechanical polishing.

8. A method of fabricating a gate stack for a semiconductor device, said method comprising steps of:
    depositing a first metal layer comprising at least one of TiN, TaN, TiC, and TaC over a gate dielectric layer;
    annealing the replacement gate structure in an ambient atmosphere containing hydrogen gas after said depositing the first metal layer;
    removing the first metal layer after the first metal layer has been annealed during said annealing the replacement gate structure;
    depositing a second metal layer of low resistivity metal on the gate dielectric layer of the annealed replacement gate structure; and
    depositing a gap fill layer over the second metal layer.

9. The method of claim 8 wherein the annealing is performed at a temperature range of 600° C.-700° C.

10. The method of claim 9 wherein depositing the second metal layer of low resistivity metal comprises:
    depositing a work function metal; and
    depositing a gap fill metal of low resistivity.

11. The method of claim 10 wherein depositing the second metal layer of low resistivity metal comprises depositing a thermally stable metal alloy.

12. The method of claim 11 wherein depositing the thermally stable metal alloy comprises deposition by atomic layer deposition.

13. The method of claim 12 wherein depositing the thermally stable metal alloy comprises deposition by physical vapor deposition.

14. The method of claim 8 further comprising performing chemical mechanical polishing.

15. A method of fabricating a gate stack for a FinFET device, said method comprising steps of:
    growing a gate dielectric layer on a channel region of a fin structure;
    depositing a first metal layer comprising at least one of TiN, TaN, TiC, and TaC over the dielectric layer;
    annealing the replacement gate structure in an ambient atmosphere containing hydrogen gas after said depositing the first metal layer;
    removing the first metal layer after the annealing step;
    depositing a second metal layer of low resistivity metal; and
    depositing a gap fill layer over the annealed replacement gate structure.

16. The method of claim 15 wherein the annealing is performed at a temperature range of 600° C.-700° C.

17. The method of claim 15 wherein depositing the first metal layer comprises depositing a thermally stable metal alloy.

18. The method of claim 15 wherein depositing the thermally stable metal alloy comprises deposition by atomic layer deposition.

19. The method of claim 15 wherein depositing the thermally stable metal alloy comprises deposition by physical vapor deposition.

20. The method of claim 15 further comprising chemical mechanical planarization.

* * * * *